US008963647B2

(12) United States Patent
Chakrabartty (10) Patent No.: US 8,963,647 B2
(45) Date of Patent: Feb. 24, 2015

(54) SELF-POWERED TIMER APPARATUS

(71) Applicant: Board of Trustees of Michigan State University, East Lansing, MI (US)

(72) Inventor: Shantanu Chakrabartty, Williamston, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 92 days.

(21) Appl. No.: 13/771,890

(22) Filed: Feb. 20, 2013

(65) Prior Publication Data

US 2014/0232444 A1    Aug. 21, 2014

(51) Int. Cl.
| H03B 5/00 | (2006.01) |
| H03K 3/353 | (2006.01) |
| G04F 5/00 | (2006.01) |
| G04F 10/10 | (2006.01) |
| G11C 16/04 | (2006.01) |

(52) U.S. Cl.
CPC ............... *G11C 16/04* (2013.01); *G04F 10/10* (2013.01)
USPC ...................... 331/108 R; 331/173; 368/156

(58) Field of Classification Search
USPC ....... 327/291; 331/107 R, 108 R, 111, 113 R, 331/143–145, 149, 153, 172–174; 365/185.01, 185.05, 185.25; 368/1, 9, 368/89, 107, 108, 118, 121, 155, 156
See application file for complete search history.

(56) References Cited

U.S. PATENT DOCUMENTS

| 5,760,644 | A | * | 6/1998 | Lancaster et al. ............. 327/566 |
| 5,852,582 | A | * | 12/1998 | Cleveland et al. ............ 365/222 |
| 6,492,843 | B1 | | 12/2002 | Giduturi et al. |
| 6,856,581 | B1 | * | 2/2005 | Berstis et al. ................. 368/121 |
| 7,075,284 | B2 | * | 7/2006 | Watanabe et al. .......... 324/76.11 |
| 7,757,565 | B2 | | 7/2010 | Chakrabartty |
| 7,884,416 | B2 | * | 2/2011 | Watanabe et al. ............. 257/320 |
| 8,056,420 | B2 | | 11/2011 | Chakrabartty |
| 8,331,203 | B2 | * | 12/2012 | La Rosa ........................ 368/113 |
| 2006/0087360 | A1 | * | 4/2006 | Watanabe ...................... 327/365 |
| 2007/0247915 | A1 | * | 10/2007 | Kalnitsky et al. ........ 365/185.18 |

(Continued)

FOREIGN PATENT DOCUMENTS

| CN | 101619714 | 1/2010 |
| WO | WO-03083769 A1 | 10/2003 |

OTHER PUBLICATIONS

C. Huang et al, "An Asynchronous Analog Self-Powered CMOS Sensor-Data-Logger With a 13.56 MHz RF Programming Interface", IEEE Journal of Solid-State Circuits, vol. 47, No. 2 (2012).

(Continued)

*Primary Examiner* — Levi Gannon
(74) *Attorney, Agent, or Firm* — Harness, Dickey & Pierce, P.L.C.

(57) ABSTRACT

A method is provided for implementing a timer using a floating-gate transistor. The method includes: injecting a charge into a floating-gate transistor at an initial time, where a gate terminal of the floating-gate transistor is comprised of polysilicon encased by an insulating material; creating lattice imperfections at boundary of the polysilicon to cause leakage from the floating-gate transistor; measuring current read out from the floating-gate transistor at a time subsequent to the initial time; and determining an amount of time between the initial time and the subsequent time using the measured current.

17 Claims, 6 Drawing Sheets

(56) References Cited

U.S. PATENT DOCUMENTS

2008/0074180 A1    3/2008  Watanabe et al.
2011/0084814 A1*   4/2011  Ramsch .................... 340/10.32

OTHER PUBLICATIONS

C. Bennett, "The Thermodynamics of Computation—a Review", International Journal of Theoretical Physics, vol. 21, No. 12 (1982).

C. Huang et al, "Rail-to-Rail, Linear Hot-Electron Injection Programming of Floating-Gate Voltage Bias Generators at 12-Bit Resolution", IEEE Journal of Solid-State Circuits, vol. 46, No. 11 (2011).

R. Ramprasad, "Phenomenological Theory to Model Leakage Currents in Metal-Insulator-Metal Capacitor Systems", Physica Status Solidi (b), vol. 239, No. 1 (2003).

M. O'Halloran et al, "A 10-nW 12-bit Accurate Analog Storage Cell With 10-aA Leakage", IEEE Journal of Solid-State Circuits, vol. 39, No. 11 (2004).

G. Park et al, "Energy Harvesting for Structural Health Monitoring Sensor Networks", ASCE Journal of Infrastructure Systems, vol. 14, No. 1 (2008).

L. B. Kish, "Thermal Noise Engines", Chaos, Solitons and Fractals, vol. 44 (2011).

* cited by examiner

SELF-POWERED TIMER APPARATUS

GOVERNMENT RIGHTS

This invention was made with government support under Grant No. 0954752 awarded by the National Science Foundation. The U.S. Government has certain rights in this invention.

FIELD

The present disclosure relates to a self-powered timer apparatus.

BACKGROUND

Figure 1:
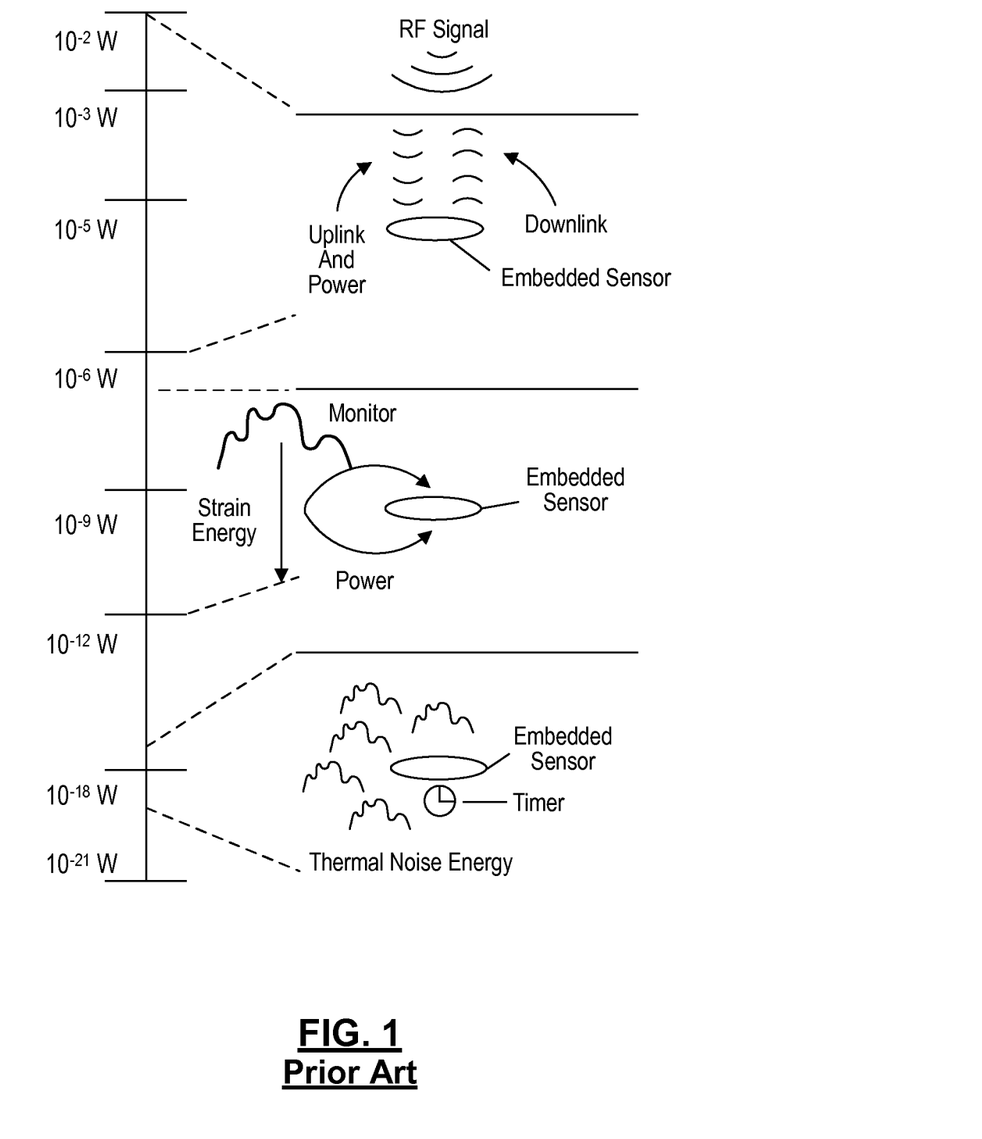
FIG. 1 is a diagram showing different amounts of scavengeable power levels and the corresponding sensor functionality that can be achieved.

Energy scavenging sensors which operate by harvesting energy from its ambient environment are useful for long-term sensing applications where the use of batteries (rechargeable or non-rechargeable) is considered to be impractical. Depending on the level of ambient energy that is available, the sensor can implement different functionalities that range from complex signal-processing to wirelessly transmitting data to an external radio-receiver. FIG. 1 shows a typical range of scavengeable power and different sensor functionalities that can be achieved at these power levels. For instance, the self-powered sensor which was reported in "An asynchronous analog self-powered cmos sensor-data-logger with a 13.56 mhz rf programming interface", C. Huang et al can scavange nanowatts of power from ambient strain variations and can compute and store the statistics of the strain-signal. As the scavengeable power level is increased, the stored statistics can be wirelessly transmitted, as shown in FIG. 1.

However, a major limitation of remotely powered sensor (e.g. using strain variations or using RF) is that events being monitored by the sensor cannot be time-stamped. This is because the sensor does not have access to a system timer or clock that is continuously active for the entire monitoring period. For a typical structural health monitoring application, the monitoring period could easily span more than 20 years. One method to achieve continuous powering is to scavenge energy from perennial sources of power like ambient thermal-noise, as illustrated in FIG. 1. Also shown in FIG. 1 is that the typical power-level of ambient-thermal-noise$\approx 10^{-18}$W, which is challenging for operating conventional electronic devices. In this regards, biology serves as a motivation providing several examples where many biochemical computations (e.g. for DNA hybridization) are driven by thermal-noise and in many instances the computations are robust to variations in ambient temperature. Thermally-driven and diffusion-based information processing was also proposed by Charles Bennett as a way to approach fundamental limits of computation (in terms of energy-efficiency).

Therefore, there is a need for a self-powered timer that is driven by thermal processes and thermal energy.

This section provides background information related to the present disclosure which is not necessarily prior art.

SUMMARY

A method is provided for implementing a self-powered timer using a floating-gate transistor. The method includes: injecting a charge into a floating-gate transistor at an initial time, where a gate terminal of the floating-gate transistor is comprised of polysilicon encased by an insulating material; creating lattice imperfections at boundary of the polysilicon to cause leakage from the floating-gate transistor; measuring current read out from the floating-gate transistor at a time subsequent to the initial time; and determining an amount of time between the initial time and the subsequent time using the measured current.

In one aspect, the method for implementing a self-powered timer uses a floating-gate transistor and a reference floating-gate transistor. In this case, the method includes: injecting a charge into a first floating-gate transistor and a reference floating-gate transistor during initialization; reading out a reference current from the reference floating-gate transistor at a time subsequent to the initialization; estimating a thermal voltage for the first floating-gate transistor using the reference current; reading out current from the first floating-gate transistor concurrently with the reading out of the reference current; and compensating the current read out from the first floating-gate transistor using the estimated thermal voltage.

This section provides a general summary of the disclosure, and is not a comprehensive disclosure of its full scope or all of its features. Further areas of applicability will become apparent from the description provided herein. The description and specific examples in this summary are intended for purposes of illustration only and are not intended to limit the scope of the present disclosure.

The drawings described herein are for illustrative purposes only of selected embodiments and not all possible implementations, and are not intended to limit the scope of the present disclosure. Corresponding reference numerals indicate corresponding parts throughout the several views of the drawings.

DETAILED DESCRIPTION

Figure 2A:
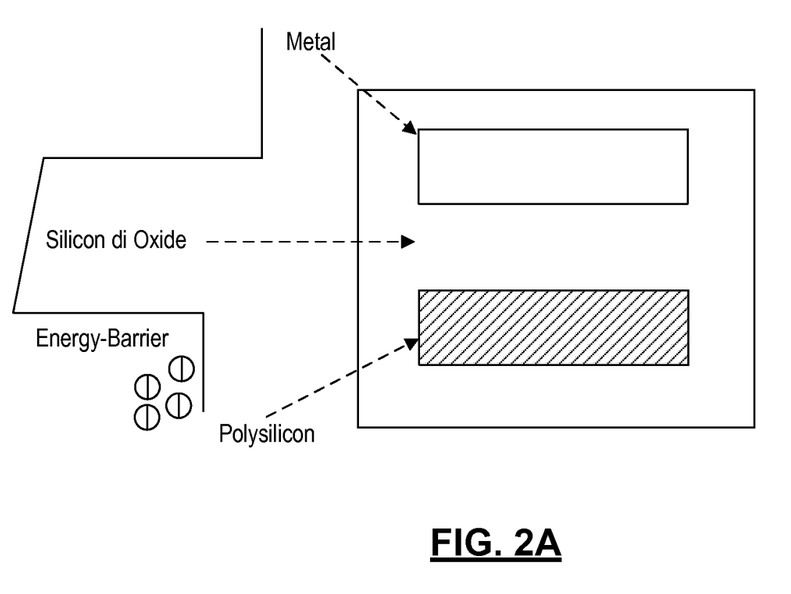
FIGS. 2A and 2B are diagrams depicting an ideal floating-gate structure and a leaky floating-gate structure, respectively, with its energy-band diagram.
Figure 2B:
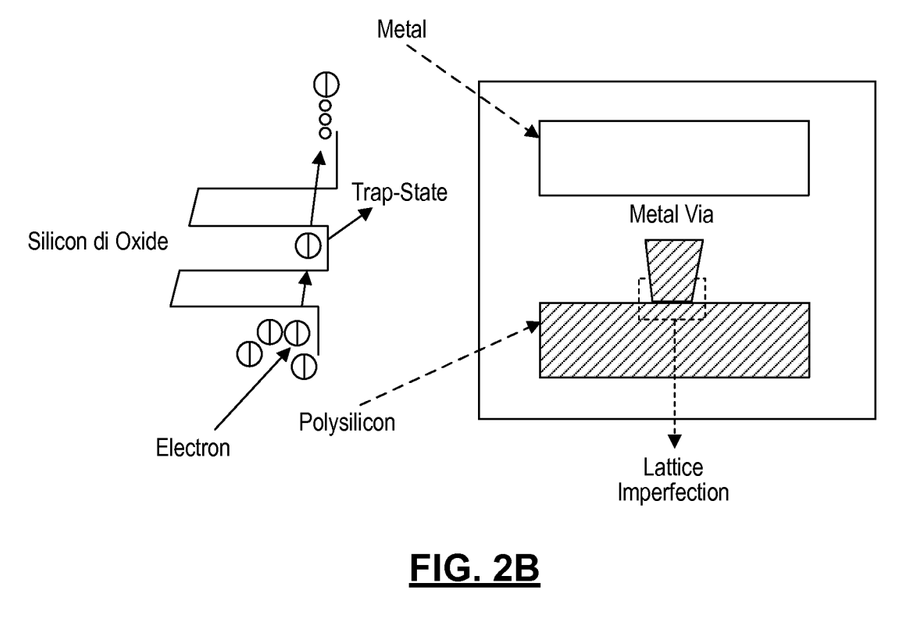

FIG. 2 illustrates how a floating-gate of a floating-gate transistor can formed by completely insulating a piece of polysilicon with an insulating material, such as silicon-dioxide. The energy band-diagram corresponding to an ideal floating-gate is also shown in FIG. 2A where the oxide forms an energy barrier that prevents the electrons to either surmount or tunnel through the barrier. Therefore, any electrons that are injected onto the floating-gate are retained for a long-period of time, demonstrating negligible leakage (e.g., retention of 8 bits over 8 years). The high-quality barrier and hence the retention is determined by the quality of polysilicon silicon-di-oxide interface, which for thermally grown oxide exhibits ultra-low density of imperfections. While reference is made to particular materials, it is understood that the broader aspects of this disclosure are applicable to other types of materials which may be used to construct a floating gate.

Referring to FIG. 2B, when a metallic contact is formed on polysilicon, the polysilicon surface is strained due to metal-polysilicon lattice mismatch and creates spurious traps at the interface. Therefore, even if the metallic junction is left unconnected, the charge on the polysilicon floating-gate leaks out over a long-duration of time (as shown in FIG. 2B). This leakage is typically considered to be a nuisance and several methods have been proposed to reduce this artifact. In this disclosure, the leakage characteristic is exploited to implement timers that can discharge electrons from the floating-gate transistor over long-durations of time.

When a potential difference exists between the floating-gate and the surrounding metal the electrons can leak out of the floating-gate due to the following three physical phenomena: (a) trap-assisted tunneling where the electrons move to an unoccupied trap-state by defects close to the metal-polysilicon-oxide interface; (b) Modified Poole-Frenkel (MPF) or internal Schottky emission of the trapped electrons into the conduction band of the silicon-di-oxide; and (c) Thermal-field emission of Fermi-level electrons from the metal directly into the conduction band of the silicon-di-oxide. While trap-assisted tunneling mainly affects the leakage current on short time-scales, MPF and thermal-field emission of electrons are dominant for long time-scales. For this disclosure, the focus is to exploit the combined effect of all the different leakage mechanism. However, a common attribute of different leakage mechanism is that the leakage current increases with the increase in the number of defects at the polysilicon interface. In other words, leakage can be effectively controlled by the number of metallic vias connected to the floating gate.

Exploiting the oxide-leakage current to implement integrators and timers would, however, require precision measurement of the drift in floating-gate voltage. For instance, a timer that discharges one volt over a period of 20 years would drift by less than 10 µV/hour. A timer read-out module can be used to determine the residual charge stored in the floating gate transistor. In one exemplary embodiment, the read-out module uses a pMOS transistor to measure the residual charge, where the gate terminal of the floating-gate transistor is electrically coupled to the gate of a pMOS transistor in the read-out module. Current flowing through the floating-gate transistor can then be measured at the drain terminal of the floating-gate transistor. The measured current is proportional to the floating-gate voltage which in turn is proportional to the residual charge retained on the floating-gate. Other techniques for reading out the current from the floating-gate transistor are also contemplated by this disclosure. It is envisioned that the read-out module could be any current measurement instrument like an integrating analog-to-digital converter or a commercial source-meter like Keithley 2400.

Figure 3:
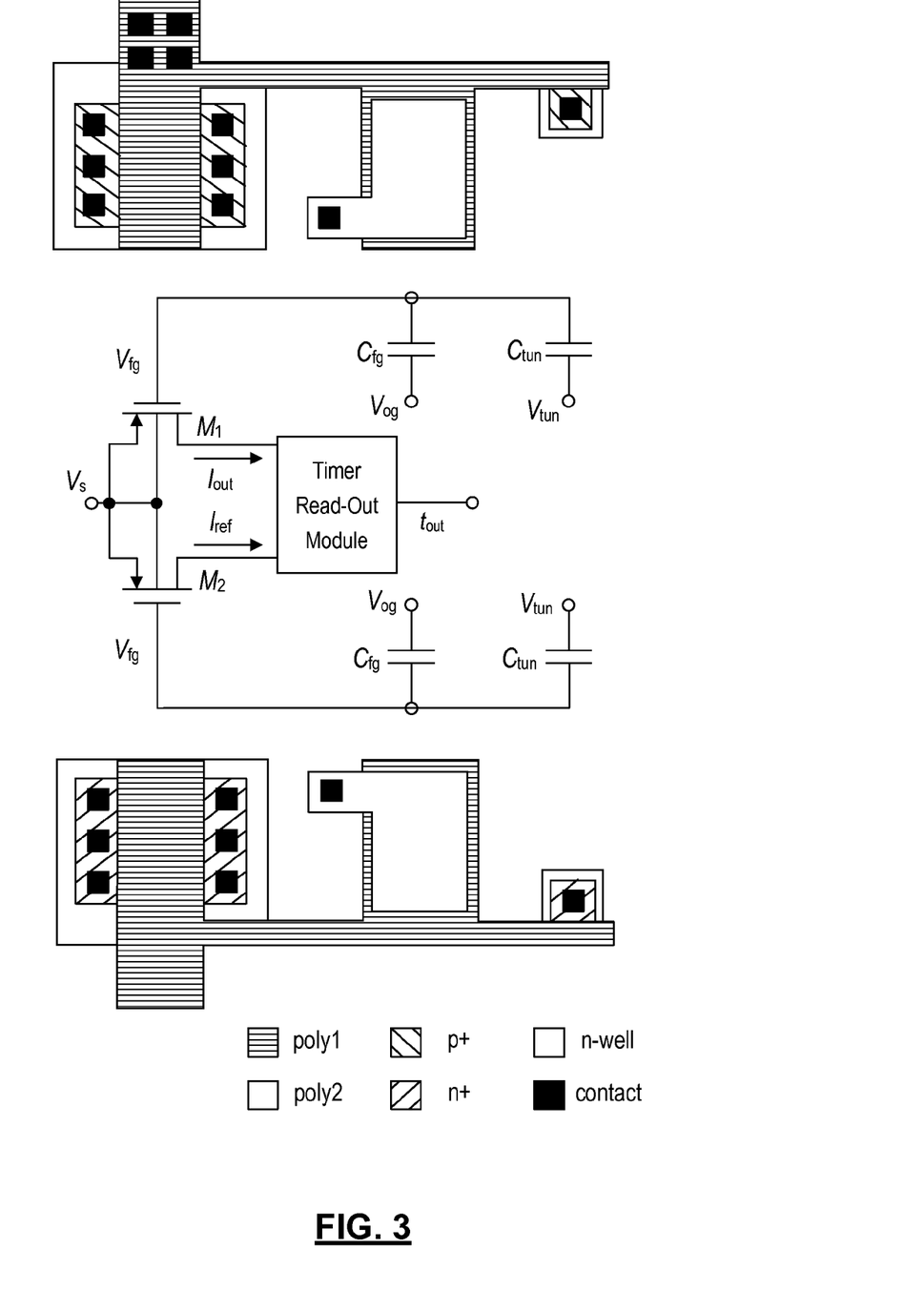
FIG. 3 is a schematic and layout of an exemplary differential timer arrangement.

FIG. 3 depicts a schematic and layout for an exemplary differential timer arrangement. The differential timer arrangement is comprised generally of a first floating-gate transistor $M_1$ and an ideal floating-gate transistor $M_2$ (with no metallic vias) acting as a reference structure. Note that the floating-gate of transistor $M_1$ has multiple floating metallic contacts. Ideally, the current through $M_2$ should remain unchanged (no leakage) once the charge on its floating-gate has been programmed.

The common method for programming floating-gates is by using FowlerNordheim (FN) tunneling or by using hot-electron injection. FN tunneling removes the electrons from the floating-gate node by applying a high-voltage (e.g., 15 V in 0.5 µm CMOS process) across a parasitic nMOS capacitor $C_{tun}$ (as shown in FIG. 3). Hot-electron injection, however, requires lower voltage (e.g., 4.2 V in 0.5 µm CMOS process) than tunneling and hence is the primary mechanism for precision programming of floating-gates. The hot-electron programming procedure, involves applying greater than 4.2 V across the source and drain terminals of the transistors $M_1$ and $M_2$. The large electric field near the drain of the pMOS transistor creates impact-ionized hot-electrons whose energy when exceeds the gateoxide potential barrier (3.2 eV) can get injected onto the floating-gate. Because the hot-electron injection in a pMOS transistor is a positive feedback process and can only be used to add electrons to the floating gate, the process needs to be carefully controlled and periodically monitored to ensure the floating-gate voltage is programmed to a desired precision. Known methods achieve the desired precision either by adjusting the duration for which the FG transistor is injected or by adjusting the magnitude of the injection pulses.

Compensating for the effects of temperature variations using the differential timer arrangement is further described. Under sub-threshold biasing, the drain current $I_{ref}$ through $M_2$ can be expressed in terms of its floating-gate charge $Q_{ref}$ as $$I_{ref} = I_0 e^{-\frac{\kappa Q_{ref}}{U_T C_T}} e^{\frac{V_s}{U_T}} \tag{1}$$

where $I_0$ is the characteristic current, $\kappa$ is the gate-efficiency factor, $C_T$ is the total capacitance of floating-gate and $U_T = kT/e$ is the thermal-voltage and is directly proportional to the ambient temperature. The reference current $I_{ref}$ could be used to compensate for the effects of temperature variations when the current $I_{out}$ is read-out. The compensation procedure involves measuring $I_{ref}$ and $I_{out}$ at two different values of the source voltage $V_{s1}$ and $V_{s2}$. Assuming an ideal matching of the transistors $M_1$ and $M_2$, the change in floating-gate charge from time-instant $t_i$ to time-instant $t_{i+1}$ can be estimated to be $$\Delta Q_{FG,i} = Q_{FG,i+1} - Q_{FG,i} \tag{2}$$

$$= -\frac{C_T}{\kappa}\left[U_{T,i+1}\ln\frac{I_{out,i+1}}{I_{ref,i+1}} - U_{T,i}\ln\frac{I_{out,i}}{I_{ref,i}}\right]$$

The index i represents the ith measurement and $U_{T,i}$ is the thermal voltage at time $t_i$. Note that $U_{T,i}$ will vary with i as during long-term measurements, the ambient temperature might vary. By measuring the reference currents $I_{ref,s1}$, $I_{ref,s2}$ at two different source voltages $V_{s1}$ and $V_{s2}$, the value of $U_{T,i}$ can be estimated as $$U_{T,i} = \frac{V_{s1} - V_{s2}}{\ln I_{ref,s1} - \ln I_{ref,s2}}. \tag{3}$$

Since temperature variations are slower compared to time difference between the $i^{th}$ and $i+1^{th}$ measurement, $U_{T,i}$ can be assumed to be equal to $U_{T,i+1}$. Hence, by combining equation 3 with equation 2, the effect of temperature variations on timer-readout can be compensated.

The accurate estimation and compensation of $U_T$ makes it possible to isolate the effect of oxide-leakage from ambient temperature effects. Since $\kappa$ and $C_T$ are almost constant with respect to time and temperature, $$\frac{\kappa \Delta Q_{FG}}{C_T}$$

can be estimated instead of $\Delta Q_{FG}$.

Next, an empirical model of the oxide-leakage current is presented. The leakage current $I_{lkg}$ is proportional to the potential difference $\Delta V$ across the floating-gate and the surrounding metal. This can be expressed as $$I_{lkg} = \kappa \Delta V \tag{4}$$

where $\kappa$ is a proportionality constant determined by defect state distribution and temperature. Deduced from equation 4, the change in $Q_{FG}$ is computed as a function of time according to $$\frac{\kappa \Delta Q_{FG}}{C_T}(t) = \frac{\kappa Q_{FG,0}}{C_T}\left(1 - e^{-\frac{\kappa}{C_T}t}\right) \tag{5}$$

This equation implies the charge on the floating-gate will change exponentially with respect to time and is similar to the transient response of an RC circuit. The time constant of this exponential decay can be estimated to be $$T = \frac{C_T}{\kappa}.$$

By varying $C_T$ and $\kappa$, timers can be implemented with different time-constants and different discharge characteristics. As indicated earlier, the parameter K can be modified by changing the density of the traps and the distance between the floating-gate and the surrounding metal. The density of traps can be increased by adding more metallic contacts in the timer layout. Other means for varying these two parameters are also contemplated by this disclosure.

Two different topologies of the proposed timer have been fabricated in a 0.5 μm standard CMOS process. The reference floating-gate structure has no vias; whereas, the floating-gate labeled "timer1" has 35 vias and the floating-gate labeled "timer2" has only one via.

Figure 4A:
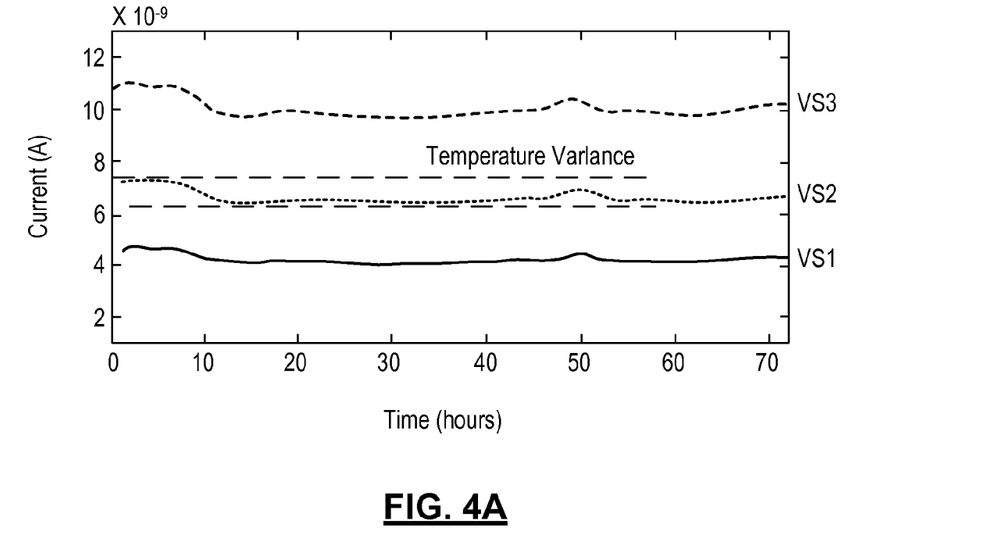
FIGS. 4A and 4B are graphs illustrating the measured source-to-drain current with respect to time for a reference structure and a leaky structure, respectively.
Figure 4B:
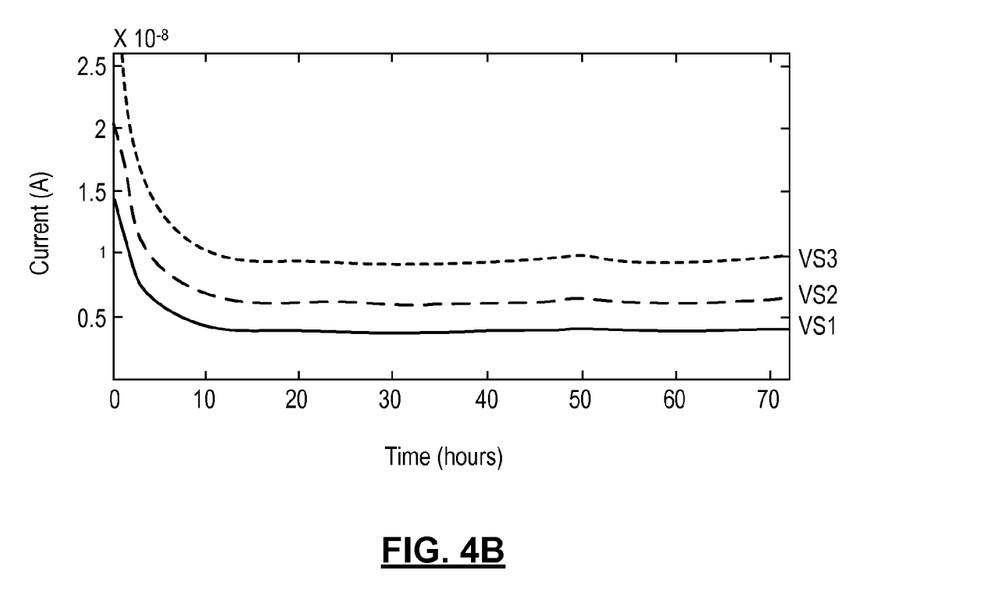

In a first set of experiments, the reference floating-gate and the timer1 floating-gate were precisely programmed to the same current (using hot-electron injection). The power-source to the timer-circuit was disabled by setting the source voltage $V_s$ to zero. The structure was periodically energized (every hour) by setting $V_s$ to $V_{s1} \cdot V_{s3}$. For each value of $V_s$, the output current $I_{out}$ and the reference current $I_{ref}$ is measured using a Keithley 2400 source meter. FIG. 4A shows the measured $I_{ref}$ with respect to time. Note that the ideal floating-gate structure should exhibit negligible leakage. Therefore, the variations in the measured $I_{ref}$ can be attributed to variations in temperature. FIG. 4B plots the measured $I_{ref}$ with respect to time and also shows variability due to temperature variations. The temperature compensation method described above was applied and FIG. 5 shows the estimated leakage characteristics corresponding to the timer1 and timer2.

Figure 5:
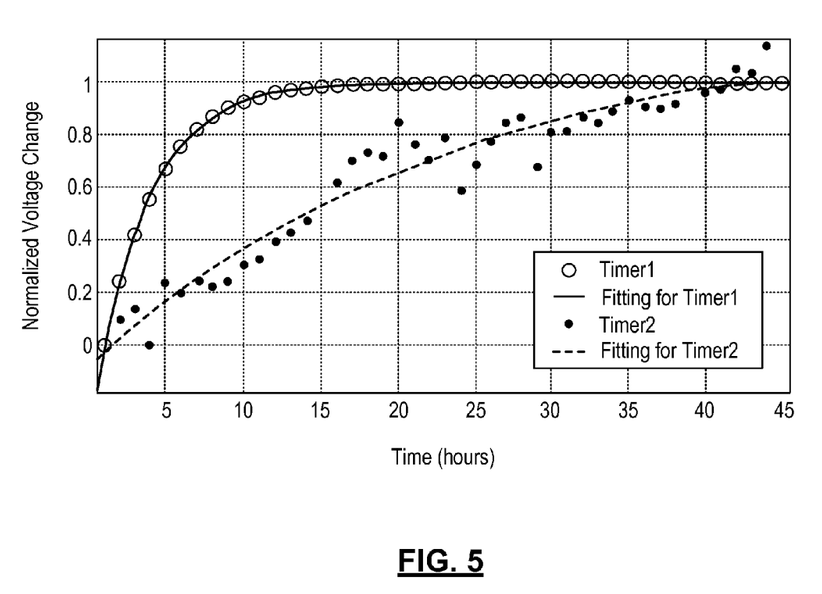
FIG. 5 is a graph illustrating the temperature compensated leakage characteristics for two example timers.

The measured results show that the timer leakage characteristics match the empirical exponential model. It can also be observed that the output of timer2 is more noisier than the output of timer1. It is because the initial voltage difference between the floating-gate and surrounding metal for timer2 is relatively smaller than that of timer1, thus the measurement is more vulnerable to the noise. The error could be reduced by using more sophisticated measurement techniques.

The fitting curves give the time constant of the corresponding timer. Based on the empirical exponential model, the time-constants for timer1 and timer2 is estimated to be approximately 3.6 hours and 24.5 hours, respectively. This result verifies the conclusion that the number of metallic contacts could affect the leakage current: more contacts lead to a smaller time-constant.

Figure 6:
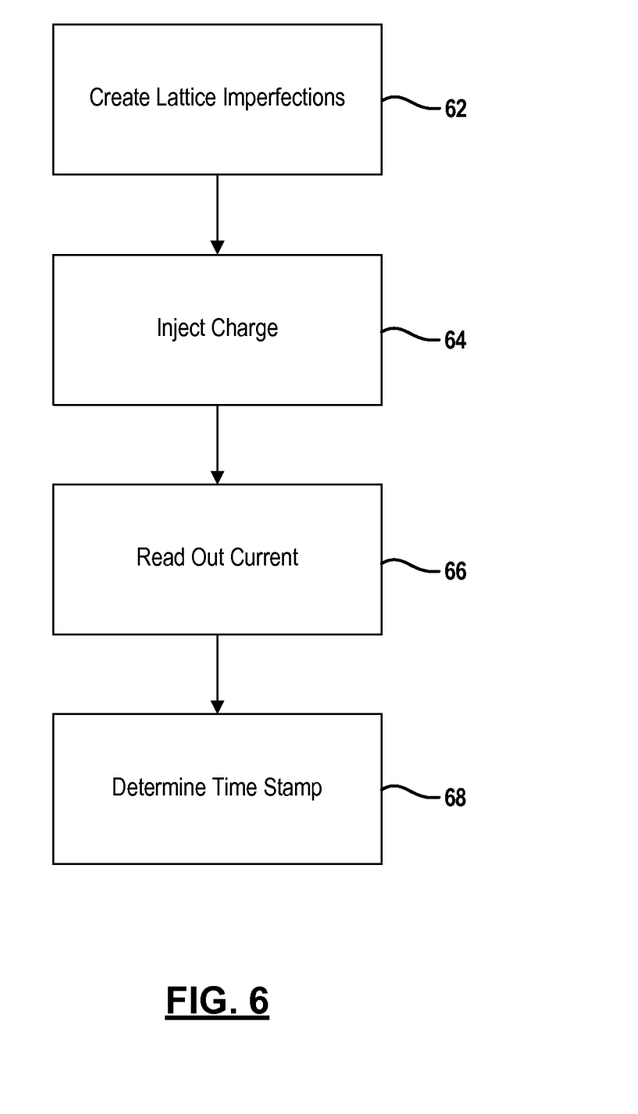
FIG. 6 is a flowchart illustrating a method for implementing a timer using a floating-gate transistor.

Given this understanding, a method for implementing a timer using a floating-gate transistor is set forth generally in relation to FIG. 6. The timer circuit includes a floating-gate transistor, where the floating-gate is comprised of polysilicon or some other silicon based material encased by an insulating material. Of note, the boundary of the polysilicon is created at 62 with lattice imperfections to cause leakage from the floating-gate transistor. In one exemplary embodiment, the lattice imperfections are created by electrically connecting one or more metal vias to the polysilicon of the floating-gate transistor as discussed above. Other techniques for creating lattice imperfections also fall within the broader aspects of this disclosure. It is also understood that other circuit components, such as capacitors, may be need to implement the timer circuit.

To initiate the timer, a charge is injected at 64 into the floating-gate transistor. The charge may be injected, for example using a linear hot-electron injection technique as described in U.S. provisional application No. 61/602,247 entitled "Self-Powered Strain Gauge" and which is incorporated herein by reference. Other techniques for injecting a charge also fall within the scope of this disclosure.

At some subsequent time, current is read out at 66 from the floating-gate transistor. The current can be read out and measured using a timer read-out module as noted above. The measured current is proportional to the potential difference across the floating-gate and thus the residual charge on the floating-gate. Furthermore, the charge on the floating-gate will change exponentially with respect to time as shown in equation (5) above. Accordingly, the amount of time between the time of initialization and the time the current is read out from the transistor can be determined at 68 by computing the change in charge, $Q_{FG}$, on the floating-gate transistor. In this way, the floating-gate transistor can serve as a timer.

In one embodiment, the timer arrangement may be implemented in a self-powered sensor. For further details regarding an exemplary self-powered sensor, reference may be made to U.S. Pat. Nos. 7,757,565 and 8,056,420. Moreover, it is contemplated that broader concept of implementing such a timer is applicable outside of self-powered sensors.

The techniques for computing the amount of time may be implemented by one or more computer programs executed by one or more processors of the timer read-out module. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

Some portions of the above description present the techniques described herein in terms of algorithms and symbolic representations of operations on information. These algorithmic descriptions and representations are the means used by those skilled in the data processing arts to most effectively convey the substance of their work to others skilled in the art.

These operations, while described functionally or logically, are understood to be implemented by computer programs. Furthermore, it has also proven convenient at times to refer to these arrangements of operations as modules or by functional names, without loss of generality.

Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system memories or registers or other such information storage, transmission or display devices.

Certain aspects of the described techniques include process steps and instructions described herein in the form of an algorithm. It should be noted that the described process steps and instructions could be embodied in software, firmware or hardware, and when embodied in software, could be downloaded to reside on and be operated from different platforms used by real time network operating systems.

The timer read-out module may be specially constructed for the required purposes, or it may comprise a general-purpose computer selectively activated or reconfigured by a computer program stored on a computer readable medium that can be accessed by the computer. Such a computer program may be stored in a tangible computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for implementing a timer using a floating-gate transistor, where the floating-gate transistor includes a floating gate terminal electrically isolated from a control terminal and the floating gate terminal is comprised of polysilicon encased by an insulating material, comprising:

changing leakage rate of the floating-gate transistor by creating lattice imperfections at boundary of the polysilicon after the fabrication of the polysilicon;

injecting a charge into a floating-gate transistor at an initial time;

injecting a charge into a reference floating-gate transistor at the initial time;

estimating a thermal voltage at the initial time using the reference current;

measuring current read out from the floating-gate transistor at a time subsequent to the initial time;

measuring a reference current read out from the floating-gate transistor at the subsequent time;

compensating the current read out from the floating-gate transistor using the estimated thermal voltage; and determining an amount of time between the initial time and the subsequent time using the compensated current.

2. The method of claim 1 wherein creating lattice imperfections further comprises placing metal in contact with the polysilicon.

3. The method of claim 1 wherein measuring current further comprises using a metal-oxide-semiconductor field-effect transistor having a gate coupled to a gate of the floating-gate transistor.

4. The method of claim 1 further comprises determining the amount of time by computing change in charge, $Q_{FG}$, on the floating-gate transistor as a function of time according to $$\frac{\kappa \Delta Q_{FG}}{C_T}(t) = \frac{\kappa Q_{FG0}}{C_T}\left(1 - e^{-\frac{\kappa}{C_T}t}\right)$$

where $C_T$ is total capacitance of the floating-gate transistor and k is the gate-efficiency factor.

5. The method of claim 1 further comprise controlling rate of leakage from the floating-gate transistor by varying total amount of capacitance of the floating gate transistor.

6. A method for implementing a timer using a floating-gate transistor, comprising:

injecting a charge into a first floating-gate transistor and a reference floating-gate transistor during initialization, where each of the floating-gate transistors is comprised of polysilicon encased by an insulating material and the first floating-gate transistor having lattice imperfections at boundary of the polysilicon;

reading out a reference current read out from the reference floating-gate transistor at a time subsequent to the initialization;

estimating a thermal voltage for the first floating-gate transistor using the reference current;

reading out current from the first floating-gate transistor concurrently with the reading out of the reference current; and compensating the current read out from the first floating-gate transistor using the estimated thermal voltage.

7. The method of claim 6 further comprises determining an amount of time between the initialization and the time at which current is read out from the first floating-gate transistor using the compensated current read out from the first floating-gate transistor.

8. The method of claim 7 further comprises determining the amount of time by computing change in charge, $Q_{FG}$, on the floating-gate transistor as a function of time according to $$\frac{\kappa \Delta Q_{FG}}{C_T}(t) = \frac{\kappa Q_{FG0}}{C_T}\left(1 - e^{-\frac{\kappa}{C_T}t}\right)$$

where $C_T$ is total capacitance of the floating-gate transistor and k is the gate-efficiency factor.

9. The method of claim 6 further comprises electrically connecting one or more metal vias to the polysilicon of the first floating-gate transistor to create lattice imperfections.

10. The method of claim 6 further comprises estimating a thermal voltage for the first floating-gate transistor in accordance with $$U_{T,i} = \frac{V_{s1} - V_{s2}}{\ln I_{ref,s1} - \ln I_{ref,s2}}$$

where $I_{ref,s1}$, $I_{ref,s2}$ is the reference current measured at two different source voltages $V_{s1}$ and $V_{s2}$.

11. A timer for use in a self-powered sensor, comprising:
a substrate;
a timer floating-gate transistor formed on the substrate, the first floating-gate transistor having a control terminal and a gate terminal, where metal is placed in contact with material forming the gate terminal and the metal along with the material forming the gate terminal are encased in an insulating material to form the gate terminal;
a reference floating-gate transistor formed on the substrate and disposed adjacent to the first floating-gate transistor;
a read-out circuit interfaced with the timer floating-gate transistor and the reference floating-gate transistor and operable to read out a timer current from the timer floating-gate transistor and a reference current from the reference floating-gate transistor; and
a controller configured to measure the timer current read out from the timer floating-gate transistor and operates to determine an amount time since a charge was injected into the timer floating-gate transistor, wherein the controller estimates a thermal voltage for the timer floating-gate transistor using the reference current and compensates the timer current using the estimated thermal voltage.

12. The timer read-out module of claim 11 wherein the controller determines the amount of time by computing change in charge, $Q_{FG}$, on the floating-gate transistor as a function of time according to $$\frac{\kappa \Delta Q_{FG}}{C_T}(t) = \frac{\kappa Q_{FG0}}{C_T}\left(1 - e^{-\frac{\kappa}{C_T}t}\right)$$

where $C_T$ is total capacitance of the floating-gate transistor and k is the gate-efficiency factor.

13. The timer read-out module of claim 11 wherein the read-out circuit is configured with a first input node that couples to a drain terminal of the timer floating-gate transistor and a second input node that couples to a drain terminal of the reference floating-gate transistor.

14. A method for implementing a timer using a floating-gate transistor, comprising:
injecting a charge into a first floating-gate transistor and a reference floating-gate transistor during initialization, where each of the floating-gate transistors include metal placed in contact with material forming a gate terminal and the metal along with the material forming the gate terminal are encased in an insulating material;
reading out a reference current read out from the reference floating-gate transistor at a time subsequent to the initialization;
estimating a thermal voltage for the first floating-gate transistor using the reference current;
reading out current from the first floating-gate transistor concurrently with the reading out of the reference current; and
compensating the current read out from the first floating-gate transistor using the estimated thermal voltage.

15. The method of claim 14 further comprises determining an amount of time between the initialization and the time at which current is read out from the first floating-gate transistor using the compensated current read out from the first floating-gate transistor.

16. The method of claim 15 further comprises determining the amount of time by computing change in charge, $Q_{FG}$, on the floating-gate transistor as a function of time according to $$\frac{\kappa \Delta Q_{FG}}{C_T}(t) = \frac{\kappa Q_{FG0}}{C_T}\left(1 - e^{-\frac{\kappa}{C_T}t}\right)$$

where $C_T$ is total capacitance of the floating-gate transistor and k is the gate-efficiency factor.

17. The method of claim 14 further comprises estimating a thermal voltage for the first floating-gate transistor in accordance with $$U_{T,i} = \frac{V_{s1} - V_{s2}}{\ln I_{ref,s1} - \ln I_{ref,s2}}$$

where $I_{ref,s1}$, $I_{ref,s2}$ is the reference current measured at two different source voltages $V_{s1}$ and $V_{s2}$.

* * * * *